United States Patent
Suresh et al.

(10) Patent No.: US 9,990,452 B2
(45) Date of Patent: Jun. 5, 2018

(54) LOW POWER CORRUPTION OF MEMORY IN EMULATION

(71) Applicant: Mentor Graphics Corporation, Wilsonville, OR (US)

(72) Inventors: Krishnamurthy Suresh, Noida (IN); Mukesh Gupta, Noida (IN); Praveen Shukla, Greater Noida (IN); Sanjay Gupta, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days. days.

(21) Appl. No.: 14/941,481

(22) Filed: Nov. 13, 2015

(65) Prior Publication Data

US 2017/0140084 A1     May 18, 2017

(51) Int. Cl.
*G06F 17/00* (2006.01)
*G06F 17/50* (2006.01)
*G06F 1/32* (2006.01)

(52) U.S. Cl.
CPC ........ *G06F 17/5027* (2013.01); *G06F 1/3275* (2013.01); *G06F 1/3287* (2013.01); *G06F 17/5036* (2013.01)

(58) Field of Classification Search
USPC ........................................................ 716/106
See application file for complete search history.

(56) References Cited

U.S. PATENT DOCUMENTS

| | | | |
|---|---|---|---|
| 5,815,688 | A | 9/1998 | Averill |
| 6,263,302 | B1 | 7/2001 | Hellestrand et al. |
| 6,539,503 | B1 | 3/2003 | Walker |
| 6,934,832 | B1 | 8/2005 | Van Dyke et al. |
| 8,793,628 | B1 | 7/2014 | Varma |
| 2002/0101824 | A1 | 8/2002 | Ziedman |
| 2003/0154342 | A1 | 8/2003 | Southwell et al. |
| 2005/0114113 | A1* | 5/2005 | Quayle ............... G06F 17/5022 703/25 |
| 2005/0198606 | A1* | 9/2005 | Gupta ............ G01B 31/318314 716/104 |
| 2006/0015313 | A1* | 1/2006 | Wang .................. G06F 17/5027 703/14 |

(Continued)

OTHER PUBLICATIONS

Wikipedia ("Cache Memory", https://en.wikipedia.org/wiki/Cache_memory, 28 pages, printed May 1, 2017).

(Continued)

*Primary Examiner* — Mohammed Alam
(74) *Attorney, Agent, or Firm* — Banner & Witcoff, Ltd.

(57) ABSTRACT

Aspects of the disclosed technology relate to techniques for corrupting memories in emulation. After a power domain in a circuit design being emulated in an emulator is powered down, a main memory model for a memory in the power domain is corrupted and a cache memory model for the memory is invalidated. The cache memory model is a hardware model in the emulator and the main memory model is a software model in a workstation coupled to the emulator. The cache memory model stores a subset of data that are stored in the main memory model. The combination of the main memory model and the cache memory model is used to model the memory.

20 Claims, 3 Drawing Sheets

Flow chart
300

(56) References Cited

U.S. PATENT DOCUMENTS

| | | | |
|---|---|---|---|
| 2006/0253762 A1* | 11/2006 | Schalick | G01R 31/31704 714/742 |
| 2008/0167854 A1 | 7/2008 | Gupta et al. | |
| 2008/0216073 A1 | 9/2008 | Yates et al. | |
| 2009/0271167 A1* | 10/2009 | Zhu | G06F 17/5027 703/14 |
| 2010/0095256 A1* | 4/2010 | Kavalpati | G06F 17/504 716/111 |
| 2010/0114915 A1 | 5/2010 | Gorton, Jr. | |
| 2010/0115494 A1 | 5/2010 | Gorton, Jr. | |
| 2010/0280995 A1* | 11/2010 | Munegowda | G06F 11/1435 707/648 |
| 2010/0295606 A1* | 11/2010 | Tsuchiya | G06F 17/5045 327/534 |
| 2011/0126219 A1 | 5/2011 | Singh et al. | |
| 2011/0184717 A1* | 7/2011 | Erickson | G06F 17/5027 703/28 |
| 2011/0185241 A1* | 7/2011 | Erickson | G06F 11/3632 714/724 |
| 2012/0159513 A1 | 6/2012 | Pakhunov et al. | |
| 2013/0198703 A1* | 8/2013 | Lu | G06F 17/5045 716/107 |
| 2013/0339672 A1* | 12/2013 | Jacobi | G06F 9/30 712/220 |
| 2014/0052430 A1* | 2/2014 | Suresh | G06F 17/5027 703/14 |
| 2014/0082121 A1 | 3/2014 | Tune | |
| 2015/0261590 A1* | 9/2015 | Sperber | G06F 11/0721 714/42 |
| 2015/0301108 A1* | 10/2015 | Hamid | G01R 31/3177 714/724 |
| 2016/0283391 A1 | 9/2016 | Nilsson et al. | |
| 2017/0052876 A1 | 2/2017 | Svensson et al. | |

OTHER PUBLICATIONS

May 8, 2017—(U.S.) Non-Final Office Action—U.S. Appl. No. 14/941,471.

May 5, 2017—(U.S.) Notice of Allowance—U.S. Appl. No. 14/941,460.

Jan. 6, 2017—(U.S.) Non-Final Office Action—U.S. Appl. No. 14/941,460.

* cited by examiner

Flow chart
300

FIG. 3

LOW POWER CORRUPTION OF MEMORY IN EMULATION

FIELD OF THE DISCLOSED TECHNOLOGY

The present disclosed technology relates to the field of circuit design verification technology. Various implementations of the disclosed technology may be particularly useful for emulating power-aware designs.

BACKGROUND OF THE DISCLOSED TECHNOLOGY

Modern integrated circuit designs have become extremely complex. As a result, various techniques have been developed to verify that circuit designs will operate as desired before they are implemented in an expensive manufacturing process. For example, logic simulation is a tool used for verifying the logical correctness of a hardware design. Designing hardware today involves writing a program in the hardware description language. A simulation may be performed by running that program. If the program runs correctly, then one can be reasonably assured that the logic of the design is correct at least for the cases tested in the simulation.

Software-based simulation, however, may be too slow for large complex designs such as SoC (System on Chip) designs. Although design reuse, intellectual property, and high-performance tools all can help to shorten SoC design time, they do not diminish the system verification bottleneck, which consumes 60-70% of the design cycle. Hardware emulation provides an effective way to increase verification productivity, speed up time-to-market, and deliver greater confidence in final products. In hardware emulation, a portion of a circuit design or the entire circuit design is emulated with an emulation circuit or "emulator."

Two categories of emulators have been developed. The first category is programmable logic or FPGA (field programmable gate array)-based. In an FPGA-based architecture, each chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route is performed on the FPGA chips in a way that preserves the connectivity in the original circuit design. The programmable logic chips employed by an emulator may be commercial FPGA chips or custom-designed emulation chips containing programmable logic blocks.

The second category of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. Whether FPGA-based or processor-based, an emulator performs circuit verification generally in parallel since the entire circuit design executes simultaneously as it will in a real device. By contrast, a simulator performs circuit verification by executing the hardware description code serially. The different styles of execution can lead to orders of magnitude differences in execution time.

An emulator typically has an interface to a workstation server (workstation). The workstation provides the capability to load the DUV (design under verification, also referred to as DUT—design under test) model, controls the execution over time, and serves as a debugging interface into the DUV model on the emulator. The DUV model may also be referred to as circuit emulation model.

Memories are an important part of modern electronic designs. Traditionally, for memories contained in the DUT inside the emulator, the challenges include how to map large memories into available physical memories on the emulator, how to download the memory contents before a test and how to upload the contents after a test run. Large memories also cause other overheads like large compile times, sub-optimal clock speeds etc. Moreover, large memories tend to be implemented on an emulator physically not close to the design logic on the emulator, causing communication delays between them.

In transaction-based environments, in addition to DUT memories, there may be memory-based buffers containing streams of data that are either stimulus to the DUT from a driver transactor or are outputs captured from the DUT to be transported to the virtual testbench for checking. These environments may have additional requirements to peek/poke memory words (or a range of words) as part of the verification methodology. These operations are traditionally implemented by DPI (Direct Programming Interface)-based accesses via the transaction based interface optimized for small packets and fast speed. Here, the memory contents upload/download operations can also be performed via the transaction based interface if the size of the overall data is relatively smaller (<16 Mbytes).

There is a new trend of verification systems where the virtual testbench running on the workstation is a more elaborate model of the real system. For example, a fast CPU (central processing unit) model running on the workstation and a GPU (graphics processing unit) model on the emulator. In such environment, a pertinent question is how to model the system memory since that has some very involved and frequent accesses from both sides. The above mentioned DPI based access technique has been adopted. This kind of custom modeling, however, has been found to be cumbersome and needs expert users to set it up. Also, manually-built setups typically are not fully optimal for performance.

The overheads due to large memories on the emulator side and the needs for frequent accesses from the software model side have prompted efforts to searching for better memory implementation techniques.

A cache-based memory implementation described below may not only address the above mentioned challenges but can also be used to improve the emulation of power-aware designs. Due to the rapid adoption of mobile devices, the semiconductor industry has essentially become a mobile-driven industry in the past few years. Consumers are demanding more from their mobile devices. In turn, their devices are demanding designs having more processing power and supporting longer battery life. Even wall-plugged equipment in a datacenter or in a network configuration needs to reduce operation costs. Energy-efficient computing has thus become an increasingly critical issue for circuit designs.

One approach for power-aware designs is to divide a design into multiple power domains. During a particular period of the operation, one or more power domains may be shut down temporarily to save power. A power domain often includes not only logic but also storage components such as registers and memories, especially in system-on-chip designs. In a state of power off, a memory is corrupted—data stored in the memory are modified or lost.

To model a real design scenario on an emulation platform, the memory in a power domain needs to be corrupted instantly when the power is turned off. Corrupting a memory in emulation, however, is tricky as it is not supported natively in memory cells of an emulator in general because the emulator cannot write to all memory addresses at once due to the limited number of write ports. One solution is to download the corrupted memory content into emulation memory. This approach is not viable because the download operation slows the run time as many memories need to be corrupted at same time.

Another approach is to use shadow registers. A bit of a shadow register serves as a flag for a memory address. When the power is turned off, all of the bits of the register may be set as "1", for example. When the power is turned on, the value of a bit is not changed to "0" until a new value is written into the corresponding address. A predetermined corrupted value may be supplied if a read operation is performed on the address before any write operation is performed. If the capacity of the memory is large, the shadow register may be replaced with a shadow memory or a shadow memory plus a shadow register. These approaches are still not feasible for very large system memories as they incur unexpected high cost in terms of either capacity or performance.

BRIEF SUMMARY OF THE DISCLOSED TECHNOLOGY

Aspects of the disclosed technology relate to techniques for corrupting memories in emulation. In one aspect, there is a method comprising: corrupting a main memory model for a memory in a power domain of a circuit design being emulated in an emulator, wherein the power domain is in a power-off state, the main memory model is a software model in a workstation coupled to the emulator, the memory is modeled by a combination of the main memory model and a cache memory model, and the cache memory model is a hardware model in the emulator, storing a subset of data that are stored in the main memory model and being synchronized with the main memory model; and invalidating the cache memory model.

The synchronization between the main memory model and the cache memory model may be conducted through an interface different from an interface for loading the emulation model to the emulator. The interface may be an interface designed for small packets of data and fast streaming speed.

The memory size of the cached memory model may be less than one percent of memory size of main memory model.

The workstation may comprise a circuit simulator model for another circuit design. The another circuit design and the circuit design are parts of a circuit system. The circuit simulation model has access to the main memory model which is transparently mapped to the cache memory model, and the circuit emulation model has access to the cache memory model which is transparently mapped to the main memory model.

The main memory model may be a sparse memory model. The size of the sparse memory model grows based on usage. The corrupting may comprise returning the main memory model to an initial state.

The main memory model and the cache memory model may be page-based. The invalidating may comprise marking pages of the cache memory model as out of date. The corrupting may comprise returning the main memory model to an initial state in which no pages are allocated, inverting data stored in the main memory model, or changing status bits for pages of the main memory model from power-on to power-off.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Various aspects of the present disclosed technology relate to techniques for corrupting memories in emulation. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "corrupt" and "invalidate" to describe the disclosed method or the device function/structure. Such terms are high-level abstractions. The actual operations or functions/structures that correspond to these terms will vary depending on the particular implementation and are readily discernible by one of ordinary skill in the art.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1A:
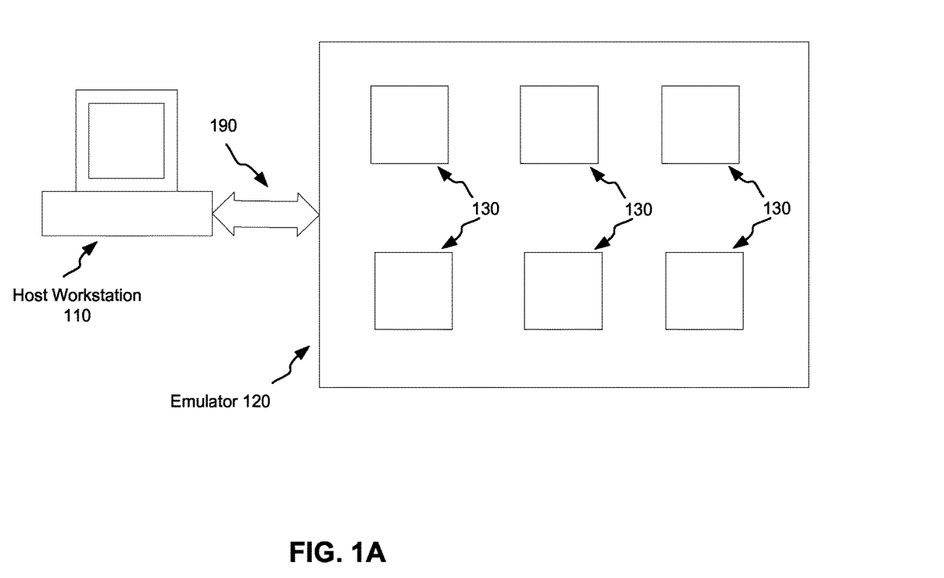
FIG. 1A shows an illustrative example of an emulation system.

FIG. 1A shows an illustrative example of an emulation system. As seen in this figure, the emulation system includes an emulator 120 coupled to a host workstation 110. The host workstation may be implemented by one or more computing systems. One computing system may include a single computer or multiple computers (e.g., a master computer and a plurality of slave computers). The emulator 120 includes multiple printed circuit boards (emulation circuit boards) 130. These emulation circuit boards 130 are networked (not shown). A circuit design may be partitioned by the host workstation 110 and loaded to the emulation circuit boards 130 for emulation.

Figure 1B:
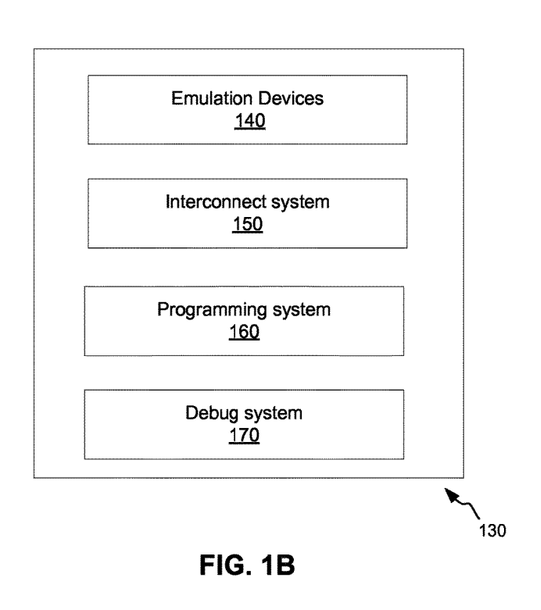
FIG. 1B shows an illustrative example of an emulation circuit board.

FIG. 1B illustrates an example of an emulation circuit board 130. The emulation circuit board 130 includes an array of emulation devices 140. The emulation devices 140 can be programmed to model, for example, combinatorial logic components, sequential circuit components and memories. The emulation devices 140 may be processor-based or FPGA-based.

Figure 1C:
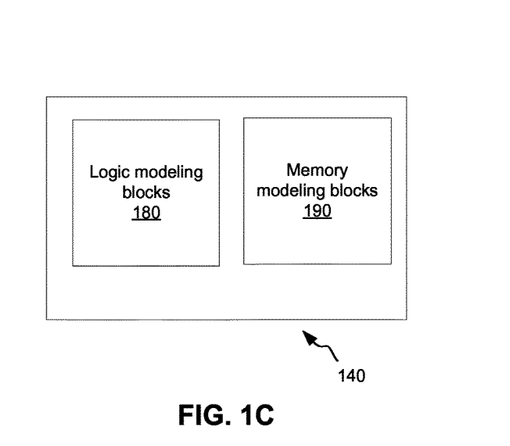
FIG. 1C shows an illustrative example of an emulation device.

FIG. 1C illustrates an example of an emulation device 140. The emulation device 140 includes a plurality of logic modeling blocks 180 and a plurality of memory modeling blocks 190. The emulation device 140 may also include an interconnect system, a programming system, and a debug system, similar to the emulation circuit board 130. The logic modeling blocks 180 use FPGAs or Boolean processors to model general combinatorial logic such as AND, OR, XOR, inversion and more complex functions for multiple inputs. The logic modeling blocks 180 may also provide for the modeling of sequential components such as flip-flops and/or latches. The memory modeling blocks 190 provide specific resources for modeling memories in circuit designs. As noted before, memories are used prevalently in modern digital logic designs and although they could be modeled with the combinatorial and sequential components in the logic modeling blocks 180, they can be more efficiently modeled with specific dedicated resources typically containing random-access memory (RAM) blocks and an interface to connect the memory blocks to the logic modeling blocks 180.

Also included in the emulation circuit board 130 are an interconnect system 150, a programming system 160, and a debug system 170. The interconnect system 150 allows data to be moved between emulation devices 140. A portion of a circuit design on one emulation device may need data computed by another portion of the design on another emulation device. The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140. The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model and initial contents of registers and design memories. This interface is, however, sub-optimal to transfer smaller sizes of data due to high fixed cost for every transfer. With various implementations of the disclosed technology, the interface system may also comprise one or more interfaces designed for small packets of data and fast streaming speed. The speed may be, for example, in the order of 2-3 Giga bits per second. These interfaces may be employed to synchronize memory images on the workstation and the emulator, as will be discussed in detail below.

Figure 2:
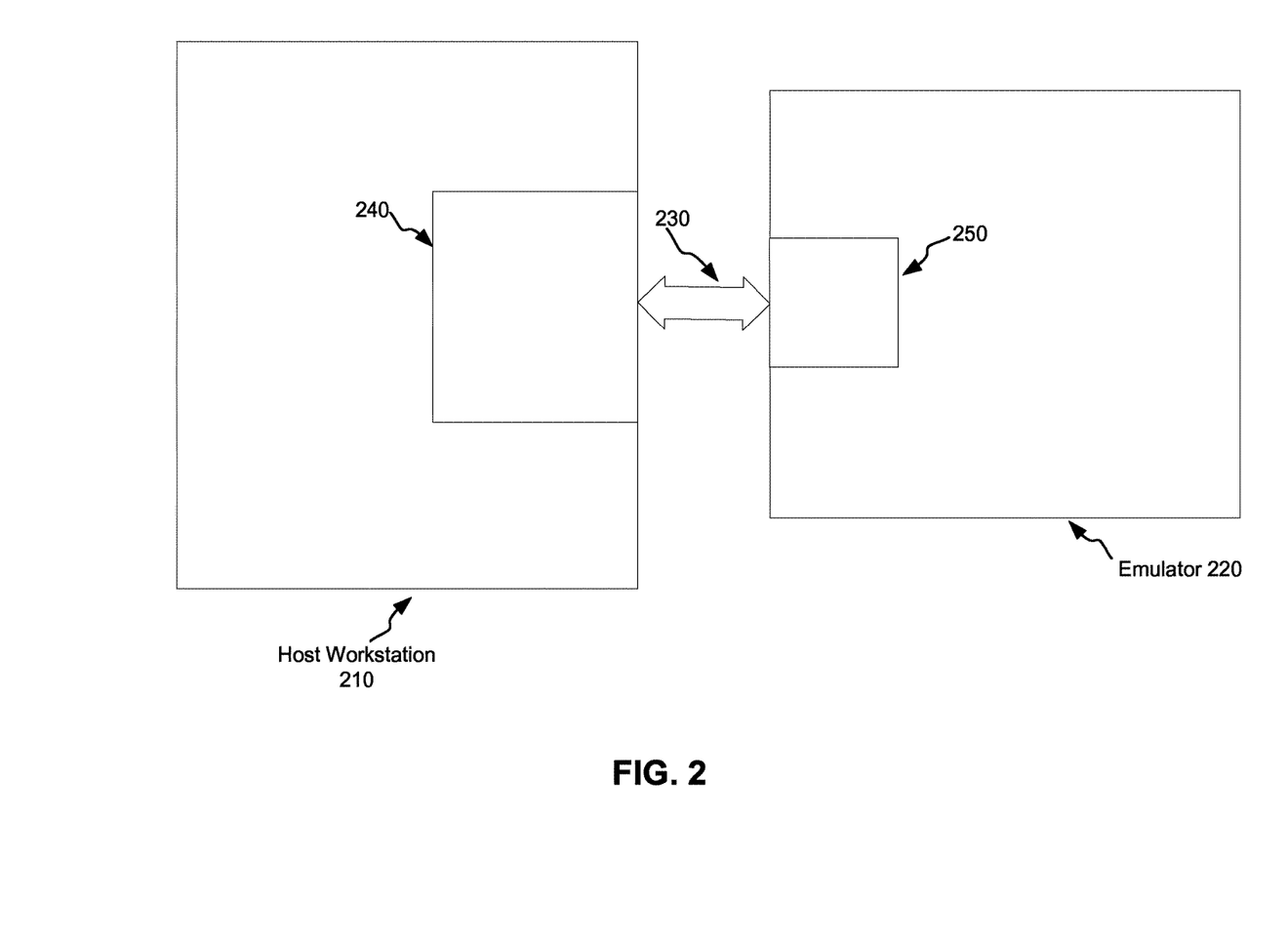
FIG. 2 illustrates an example of memory modeling for an emulation system according to various embodiments of the disclosed technology.

FIG. 2 illustrates an example of memory modeling for an emulation system according to various embodiments of the disclosed technology. The emulation system comprises a workstation 210, an emulator 220, and an interface system 230, similar to the emulation system shown in FIG. 1A. The emulation is configured with an emulation model for a circuit design. The circuit design has access to a memory. The memory is modelled with a main memory model 240 in the workstation 210 and a cache memory model 250 in the emulator 220. The cache memory model 250 stores a subset of data that are stored in the main memory model 240. The cache memory is a hardware model and the main memory model is a software model. These two models are synchronized through an interface in the interface system 230. The interface may be the interface designed for small packets of data and fast streaming speed which is discussed previously.

The main memory model 240 may be a full memory model of the memory and is a complete image of the memory. The main memory model 240 may be a sparse memory model of the memory. As a sparse model, the size of the main memory model 240 grows based on usage. A memory is often divided into pages. The page size may be determined based on applications. The number of pages of the main memory model 240 increases based on usage in a sparse implementation. If all of the pages have been accessed, the main memory model 240 may become a full memory model. The following discussion will use the page-based memory as an example. It should be appreciated that the disclosed technology can be applied to other memory configurations.

The cache memory model 250 is a partial image of the memory. For example, the cache memory model 250 is less than one percent of the memory. Various conventional caching techniques may be employed by the disclosed technology. If the emulation model of the circuit design needs to read/write a word from/to a page of the memory, the cache memory model 250 is accessed first. If the cache memory model 250 does not have the page containing the address, that page may be retrieved from the main memory model 240 through the interface designed for small packets of data and fast streaming speed. To execute the operation, design clocks may need to be stopped. If the cache memory model 250 is full, a page swap is performed. The page in the cache memory model 250 to be swapped may be the least recently used page.

Even if the cache memory model 250 has the page containing the address, the access to the page may not be allowed to execute immediately if the page is "out of date" (or "dirty"). A page is out of date when the content of the page has been changed or is being changed by the workstation. One method to keep track whether a page is up to date or not is to use a bit for each of the pages in the cache memory model 250.

When a page in the cache memory model 250 is changed by a write operation of the emulator model, if it is the first write on that page on the emulator since the page was fetched, a one-way message notifying the workstation side maybe sent. This notification will result in marking the workstation copy of the page as "out of date". Again, a one bit per page information may be kept, for example, to manage this information on the workstation side. Beyond this point, any emulator side writes to the same page can be done normally. If and when, the workstation side user model gets an opportunity to access (read or write) the same page of the main memory model 240, the cache infrastructure will fetch the contents of that page from the emulator, update its own copy, reset the workstation out of date bit, and then it will proceed with the access operation. If the access operation is a write operation, then the emulator side out of date bit for that page will also be set. Note that, the emulator sends the notification bit for an emulator write when it finds that the out-of-date bit for that page in the workstation isn't set. This may be when a first emulator write is occurring after the page was fetched. It may also be the first write after the workstation updated its copy of the page due to one or more workstation side read operations on that page.

Alternatively, when a page in the cache memory model 250 is changed by a write operation of the emulation model, a one-way message carrying the write information may be sent immediately to the workstation via the interface designed for small packets of data and fast streaming speed. Accordingly, pages of the main memory model 240 cannot be out of date. The cache memory model 250 may still employ status bits. When a page of the main memory model 240 is changed by a write operation, the corresponding status bit for the page of the cache memory model 250 will be changed to indicate the page as "out of date". If and when, the logic on the emulator gets an opportunity to access (read or write) that page, the cache infrastructure will fetch the contents of that page from the workstation.

The disclosed technology allows the memory to be accessed efficiently from both the workstation side and the emulation side. For example, the memory is shared by a hardware model of a first circuit design (e.g., a GPU) and a software model of a second circuit design (e.g., a CPU). The accesses may be mapped transparently to the hardware model and the software model, respectively. "Transparently" means "automatically". The user does not need to manage how the accesses are performed and how the synchronization is executed.

The workstation including a testbench and/or a software model and the emulator including a hardware model may execute in a serial mode. In such a mode, for example, when the hardware model is running, the testbench is in a waiting state. Once the hardware model reaches a point where a communication to the testbench is needed, the hardware model sends the communication to the workstation and then waits for the testbench to respond. Now the testbench starts to run, process the received message and send the response back. After that, the testbench goes back to a waiting state and the hardware model runs again. The above sequence goes on and on. In such a serial mode, the accesses to the memory from the emulator side and the workstation side do not occur at the same time.

The testbench and the hardware model may run simultaneously in some configurations. In such a mode, the two sides may attempt to make "simultaneous" accesses to the memory, resulting in a conflict. The system may allow an access on one side to be completed before allowing another access on the other side to proceed.

The synchronization between the cache memory model 250 and the main memory model 240 may be performed in background and in parallel to the memory access. As noted above, the running of the hardware model may be stopped to fetch a page that is not in the cache memory model 250. To minimize the wait time, prediction of pages to update may be made based on access patterns. One example is to update the next page in the background while a memory access to current page is serviced.

In certain memory types (example DDR), the memory access requests (specially read) have latencies associated with them, in the sense that the actual servicing of the request may happen after a delay (in terms of clock cycles) has elapsed from the point where the request was first made. For example, the specification might say that a read request will be serviced after 8 clock cycles—where the clock is a clock associated with the DDR interface. This kind of information may be used by the cache memory infrastructure to delay the stopping of the design clocks (after a read request say) to an amount equal to the latency available since the design really cannot use the data before the latency expires. For example, a page fetch operation requires the design clocks to be stopped for 32 emulator clock cycles. With a latency of 16 design clock cycles, the cache memory model 250 can continue to operate until the latency of 16 design clock cycles is exhausted. Design clock cycles advance to T+16 cycle as the next time point.

Common operations on memories are initializing the memory with given contents and also fetching memory contents out of the emulator. These operations can take a long time for large memories. Using a main memory model on the workstation side and a cache memory model on the emulator for a large memory addresses this problem. Memory contents can be loaded into the workstation main memory model directly for initializing the memory. The emulator side will receive the new contents as the need arises via the caching mechanism. Fetching the memory contents also can be performed by accessing the workstation side main memory model while making sure that any out-of-date pages have been fetched. So both these operations don't need to transfer the entire memory contents across the emulator and workstation link.

Accesses to the memory which are trying to load its contents from a file may be executed by marking all the pages on the emulator side as dirty and then proceeding to load the workstation image with the contents but still allowing the emulator to run forward. In such a mode if the emulator side needs a page that has not been read on the workstation side, it will block the design clocks on the emulator until the relevant page is read and is sent back to the emulator side. The memory loading on the workstation continues as long as it takes. The emulator is stopped only when it reads an unavailable page, allowing the workstation side to load the file in parallel.

Figure 3:
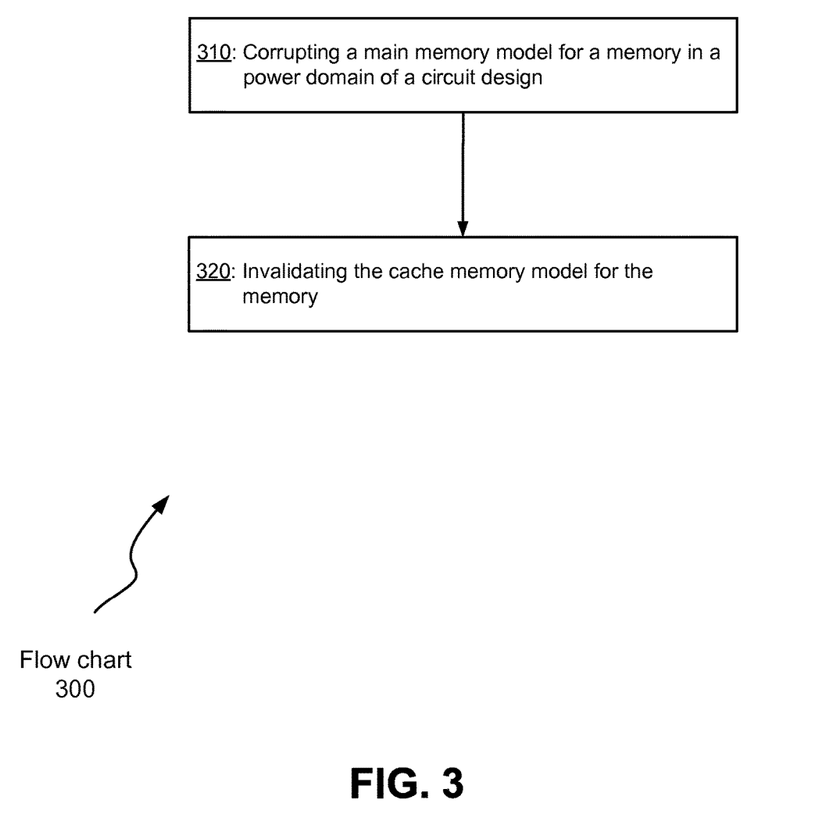
FIG. 3 illustrates a flow chart describing methods for corrupting memories in emulation that may be employed by various embodiments of the disclosed technology.

FIG. 3 illustrates a flowchart 300 describing methods for corrupting a memory in emulation that may be employed by various embodiments of the disclosed technology. The memory is modelled as discussed above by a combination of a main memory model and a cache memory model. The main memory model is a software model in the workstation coupled to the emulator. The cache memory model is a hardware model in the emulator, storing a subset of data that are stored in the main memory model and being synchronized with the main memory model.

After the power domain in which the memory is located is powered down, the main memory model is corrupted in operation 310, and the cache memory model is invalidated in operation 320. The corruption of the main memory model can be executed in various ways. If the main memory model is a page-based sparse memory model, all of the allocated pages may be returned to a free page pool and the software memory model returns to its very initial state where no pages are allocated. A corruption value (e.g., "0xdeadbeef", "0" or "1") is used as the value stored in all addresses. This operation can be completed quickly due to its nature.

Some corruption schemes require that current values stored in the memory be inverted when the power is turned off. A status bit (flag) may be set up for each of the page to indicate whether the page is corrupted or not. The corrupting in operation 310 may comprise changing status bits for pages of the main memory model from power-on to power-off (e.g., from "0" to "1"). When a first write operation is performed on a location of a page after the power is turned back on, all of the stored values of the page will be inverted first and the status bit for the page is reset.

Alternatively, stored values in all locations may be inverted when the power is turned off. This approach does not require the status bits.

It should be appreciated by a person of ordinary skill in the art that various corruption schemes may be operated at different times for one memory. It should also be appreciated by a person of ordinary skill in the art that different memories in the system may adopt different corruption schemes.

One way to invalidate the cache memory model is to mark all of the pages of the cache memory model as out of date.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method comprising:
   configuring an emulator to emulate a circuit design that is associated with a main memory, wherein the main memory is being modeled by one or more computing devices in communication with the emulator;
   configuring the emulator to emulate a cache memory that provides a subset of data stored by the main memory;
   performing, using the emulator, a part of an emulation process for emulating the circuit design; and
   during the part of the emulation process;
      updating stored values in the cache memory to synchronize the subset of the data between the cache memory and the main memory,
      responsive to determining that a power domain associated with the main memory is powered down, setting one or more values in the cache memory to indicate that the subset of data is corrupted, and
      based on determining that the circuit design is to perform a first read or write operation to the main memory, accessing the cache memory and determining whether the one or more values indicate that the subset of the data is corrupted.

2. The method recited in claim 1, wherein configuring the emulator to emulate the circuit design is performed based on one or more first transmissions via a first interface, and
   wherein the updating is performed based on one or more second transmissions via a second interface that is different from the first interface.

3. The method recited in claim 1, wherein the subset of the data is less than one percent of the data stored by the main memory.

4. The method recited in claim 1, wherein the cache memory is page-based, and wherein the subset of the data comprises one or more pages from the main memory.

5. The method recited in claim 4, wherein setting the one or more values in the cache memory to indicate that the subset of the data is corrupted comprises setting the one or more values to indicate the one or more pages are out of date.

6. The method recited in claim 1, wherein updating the stored values in the cache memory to synchronize the subset of the data between the cache memory and the main memory is performed based on:
   determining that the circuit design is to perform a second read or write operation to the main memory, wherein the second read or write operation indicates a portion of the main memory;
   determining that the cache memory does not store the portion of the main memory; and
   retrieving, from the one or more computing devices, the portion of the main memory.

7. The method recited in claim 6, wherein updating the stored values in the cache memory to synchronize the subset of the data between the cache memory and the main memory is further performed based on stopping one or more design clocks.

8. The method recited in claim 1, wherein updating the stored values in the cache memory to synchronize the subset of the data between the cache memory and the main memory is performed based on swapping one or more pages between the cache memory and the main memory.

9. A method comprising:
   configuring an emulator to emulate a circuit design that is associated with a main memory, wherein the main memory is being modeled by one or more computing devices in communication with the emulator;
   configuring the emulator to emulate a cache memory that provides a subset of data stored by the main memory;
   performing, using the emulator, a part of an emulation process for emulating the circuit design; and
   during the part of the emulation process:
      updating stored values in the cache memory to synchronize the subset of the data between the cache memory and the main memory,
      responsive to determining that a power domain associated with the main memory is powered down, setting one or more values in the cache memory to indicate that the subset of the data is invalid, and
      based on determining that the circuit design is to perform a first read or write operation to the main memory, accessing the cache memory and determining whether the one or more values indicate that the subset of the data is invalid.

10. The method recited in claim 9, wherein configuring the emulator to emulate the circuit design is performed based on one or more first transmissions via a first interface, and
wherein the updating is performed based on one or more second transmissions via a second interface that is different from the first interface.

11. The method recited in claim 9, wherein the subset of the data is less than one percent of the data stored by the main memory.

12. The method recited in claim 9, wherein the cache memory is page-based,
wherein the subset of the data comprises one or more pages from the main memory; and
wherein setting the one or more values in the cache memory to indicate that the subset of the data is invalid comprises setting the one or more values to indicate that the one or more pages are out of date.

13. The method recited in claim 9, wherein updating the stored values in the cache memory to synchronize the subset of the data between the cache memory and the main memory is performed based on:
determining that the circuit design is to perform a second read or write operation to the main memory, wherein the second read or write operation indicates a portion of the main memory;
determining that the cache memory does not store the portion of the main memory; and
retrieving, from the one or more computing devices, the portion of the main memory.

14. A system comprising:
one or more computing devices configured to model a main memory that is to be accessed by a first circuit design under test; and
an emulator configured to:
communicate with the one or more computing devices;
emulate the first circuit design under test;
emulate a cache memory that provides a subset of data stored by the main memory;
perform a part of an emulation process for emulating the first circuit design under test;
during the part of the emulation process:
update stored values in the cache memory to synchronize the subset of the data between the cache memory and the main memory,
responsive to determining that a power domain associated with the main memory is powered down, set one or more first values in the cache memory to indicate that the subset of the data is corrupted, and
based on determining that the first circuit design under test is to perform a first read or write operation to the main memory, accessing the cache memory and determining whether the one or more first values indicate that the subset of the data is corrupted.

15. The system recited in claim 14, wherein the one or more computing devices are configured to:
set one or more second values in the main memory to indicate that the main memory is corrupted.

16. The system recited in claim 15, wherein the one or more computing devices are configured to set the one or more second values in the main memory to indicate that the main memory is corrupted by setting the one or more second values to an initial state indicating that pages are not allocated in the main memory.

17. The system recited in claim 15, wherein the one or more computing devices are configured to set the one or more second values in the main memory to indicate that the main memory is corrupted by inverting the one or more second values.

18. The system recited in claim 17, wherein inverting the one or more second values comprises inverting the one or more second values from a first value indicating a power-on state to a second value indicating a power-off state.

19. The system recited in claim 14, wherein the one or more computing devices is configured to model the main memory using a software model, and wherein the one or more computing devices is further configured to:
configure a simulator model for a second circuit design under test;
perform, based on the simulator model, a part of a simulation process for simulating the second circuit design under test; and
during the part of the simulation process and based on determining that the second circuit design under test is to perform a second read or write operation to the main memory, accessing the software model.

20. The system recited in claim 14, wherein the subset of the data comprises one or more pages from the main memory, and wherein the emulator is configured to set the one or more first values in the cache memory to indicate that the subset of the data is corrupted by setting the one or more first values to indicate that the one or more pages are out of date.

* * * * *